(12) United States Patent
Ng et al.

(10) Patent No.: US 9,438,263 B1
(45) Date of Patent: Sep. 6, 2016

(54) CONTROLLABLE OPTO-ELECTRONIC TIME STRETCHER, AN ELECTRO-OPTICAL ANALOG TO DIGITAL CONVERTER HAVING NON-UNIFORM SAMPLING USING THE SAME, AND RELATED METHODS OF OPERATION

(71) Applicant: HRL LABORATORIES LLC, Malibu, CA (US)

(72) Inventors: Willie W. Ng, Agoura Hills, CA (US); Mohiuddin Ahmed, Moorpark, CA (US); Troy Rockwood, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/702,195

(22) Filed: May 1, 2015

Related U.S. Application Data

(60) Provisional application No. 61/988,133, filed on May 2, 2014, provisional application No. 62/147,493, filed on Apr. 14, 2015, provisional application No. 62/147,473, filed on Apr. 14, 2015.

(51) Int. Cl.
| | |
|---|---|
| *H03M 1/00* | (2006.01) |
| *H03M 1/12* | (2006.01) |
| *G02F 1/01* | (2006.01) |

(52) U.S. Cl.
CPC ............ *H03M 1/1245* (2013.01); *G02F 1/011* (2013.01); *H03M 1/002* (2013.01); *H03M 1/121* (2013.01)

(58) Field of Classification Search
CPC ........... H03M 1/1245; H03M 1/1205; H03M 1/124; H03M 1/121; G02F 7/00; G02F 1/3519; G02F 1/3558; G02F 1/365; G02F 2001/3528; G02F 2002/006; G02F 2203/56; G02F 3/00
USPC ............................ 341/137–142, 155; 324/96
See application file for complete search history.

(56) References Cited

U.S. PATENT DOCUMENTS

| | | |
|---|---|---|
| 5,004,342 A | 4/1991 | Bernard et al. |
| 5,327,215 A | 7/1994 | Bernard et al. |
| 5,414,548 A | 5/1995 | Tachikawa et al. |
| 6,052,495 A | 4/2000 | Little et al. |
| 6,157,274 A | 12/2000 | Tada et al. |
| 6,160,826 A | 12/2000 | Swanson et al. |
| 6,185,345 B1 | 2/2001 | Singh et al. |
| 6,636,668 B1 | 10/2003 | Al-hemyari et al. |
| 6,668,006 B1 | 12/2003 | Margalit et al. |
| 6,681,065 B1 | 1/2004 | Minasian et al. |
| 6,724,512 B2 | 4/2004 | Carlson et al. |
| 6,852,556 B2 | 2/2005 | Yap |

(Continued)

OTHER PUBLICATIONS

W. Ng et al., "Demonstration of a Large Stretch-Ratio (M=41) Photonic Analog-To-Digital Converter with 8 ENOB for an Input Signal Bandwidth of 10 GHz", IEEE Photonic Technology Letters, vol. 24 (14), pp. 1185-1187, 2012.

(Continued)

*Primary Examiner* — Ling Nguyen
(74) *Attorney, Agent, or Firm* — Ladas & Parry

(57) ABSTRACT

A controllable opto-electronic time stretcher comprising a first wave guide and a second waveguide coupled to the first waveguide along a coupling portion; wherein at least one of the first and second waveguides in the coupling portion has a controllable refractive index.

21 Claims, 8 Drawing Sheets

(56) References Cited

U.S. PATENT DOCUMENTS

| | | | |
|---|---|---|---|
| 6,870,968 B2 | 3/2005 | Griffin | |
| 6,872,985 B2 | 3/2005 | Yap | |
| 6,970,619 B2 | 11/2005 | Baumann et al. | |
| 6,992,539 B1 | 1/2006 | How | |
| 7,085,438 B2 | 8/2006 | Mizuno et al. | |
| 7,190,858 B1 | 3/2007 | Greiner et al. | |
| 7,215,848 B2 | 5/2007 | Tan et al. | |
| 7,266,258 B2 | 9/2007 | Liu et al. | |
| 7,269,312 B2 | 9/2007 | Ng et al. | |
| 7,423,564 B2* | 9/2008 | Kitayama | G02F 1/3519 341/137 |
| 7,440,653 B2 | 10/2008 | Smith et al. | |
| 7,447,387 B2 | 11/2008 | Shih et al. | |
| 7,509,048 B2 | 3/2009 | Turpin et al. | |
| 7,525,466 B2 | 4/2009 | Vanderhaegen et al. | |
| 7,561,605 B1 | 7/2009 | Delfyett et al. | |
| 7,570,184 B2* | 8/2009 | Ikeda | H03M 1/122 341/137 |
| 7,613,399 B2* | 11/2009 | Yasumoto | H04B 10/541 398/154 |
| 8,019,185 B2 | 9/2011 | Yap | |
| 8,275,263 B1* | 9/2012 | Franklin | H04B 10/506 398/182 |
| 8,334,797 B1* | 12/2012 | Ng | H03M 1/1245 341/137 |
| 8,471,750 B2 | 6/2013 | Rogers et al. | |
| 8,686,712 B2* | 4/2014 | Gupta | 324/96 |
| 8,750,438 B2 | 6/2014 | Gupta | |
| 9,052,534 B2* | 6/2015 | Sudo | G02F 2/00 |
| 2004/0114867 A1 | 6/2004 | Nielsen et al. | |
| 2004/0228564 A1 | 11/2004 | Gunn et al. | |
| 2005/0286602 A1 | 12/2005 | Gunn et al. | |
| 2006/0083456 A1 | 4/2006 | Burns et al. | |
| 2006/0215949 A1 | 9/2006 | Lipson et al. | |
| 2007/0009205 A1 | 1/2007 | Maleki et al. | |
| 2007/0206899 A1 | 9/2007 | Chu et al. | |
| 2007/0230856 A1 | 10/2007 | Yamazaki | |
| 2008/0080803 A1 | 4/2008 | Park et al. | |
| 2009/0034905 A1 | 2/2009 | Ty Tan et al. | |
| 2009/0208209 A1 | 8/2009 | Ng et al. | |
| 2010/0158429 A1 | 6/2010 | Popovic | |
| 2010/0201345 A1* | 8/2010 | Gupta | G02F 7/00 324/96 |
| 2012/0200439 A1* | 8/2012 | Hartl | G02F 1/365 341/137 |
| 2013/0315597 A1 | 11/2013 | Shaver et al. | |
| 2013/0328706 A1* | 12/2013 | Marom | H03M 1/1245 341/137 |

OTHER PUBLICATIONS

R.H. Walden, "Analog-to-Digital Conversion in the early 21st Century," in Wiley Encyclopedia of Computer Science and Engineering, edited by Benjamin Wah., John Wiley & Sons, Inc., pp. 1-14, (2008).

R. Baraniuk, "Compressive Sensing", IEEE Signal Processing Magazine, pp. 118-124, (Jul. 2007).

M. Wakin, et al., "A Non-Uniform Sampler for Wideband Spectrally-Sparse Environments", IEEE Journal on Emerging and Selected Topics in Circuits and Systems, vol. 2, No. 3, pp. 516-529, (Sep. 2012).

J. Troop, et al., "Computational Methods for Sparse Solution of Linear Inverse Problems", Proceedings of the IEEE, vol. 98, No. 6, pp. 948-958, (Jun. 2010).

Baltimore and Walden, "Analog-to-Digital Conversion in the Early Twenty-First Century," Wiley Encyclopedia of Computer Science and Engineering, pp. 1-14, (2008).

Borrelli et al., "Direct Measurement of 248- and 193-nm Excimer-Induced Densification in Silica-Germania Waveguide Blanks," J. Optical Society America B, vol. 16, No. 10, pp. 1672-1679, (Oct. 1999).

Chou et al., "4-Channel Continuous-Time 77 GSa/s ADC Using Photonic Bandwidth Compression," IEEE International Topical Meeting on Microwave Photonics, pp. 54-57, (Oct. 2007).

Chou et al., "Photonic Bandwidth Compression Front End for Digital Oscilloscopes," IEEE Journal of Lightwave Technology, vol. 27, No. 22, pp. 5073-5077, (Nov. 15, 2009).

Djordjev et al., "Microdisk Tunable Resonant Filters and Switches," IEEE Photonics Technology Letters, vol. 14, No. 6, pp. 828-830, (Jun. 2002).

Driessen et al., "Microresonators as Promising Building Blocks for VLSI Photonics," Proc. of SPIE, vol. 5956, pp. 59560Q1-59560Q14, (2005).

Gupta et al., "Distortion Cancellation in Time-Stretch Analog-to-Digital Converter," IEEE Journal of Lightwave Technology, vol. 25 No. 12, pp. 3716-3721, (Dec. 2007).

Gupta, S. and Jalali, B., "Time-Warp Correction and Calibration in Photonic Time-Stretch Analog-to-Digital Converter," Optics Letters, vol. 33, No. 22, pp. 2674-2676, (Nov. 15, 2008).

Han et al., "Photonic Time-Stretched Analog-to-Digital Converter: Fundamental Concepts and Practical Considerations," IEEE Journal of Lightwave Technology, vol. 21 No. 12, pp. 3085-3103, (Dec. 2003).

Hill, K. and Meltz, G., "Fiber Bragg Grating Technology Fundamentals and Overview," IEEE Journal of Lightwave Technology, vol. 15, No. 8, pp. 1263-1276, (Aug. 1997).

Hunt et al., "Active Optical Lattice Filters," EURASIP Journal on Applied Signal Processing, 2005:10, pp. 1452-1461, (2005).

Itoh et al., "Ultrafast Processes for Bulk Modification of Transparent Materials," MRS Bulletin, vol. 31, pp. 620-625, (Aug. 2006).

Jinguji, K. and Kawachi, M., "Synthesis of Coherent Two-Port Lattice-Form Optical Delay-Line Circuit," Journal of Lightwave Technology, vol. 13, No. 1, pp. 73-82, (Jan. 1995).

Jinguji, K., "Synthesis of Coherent Two-Port Optical Delay-Line Circuit with Ring Waveguides," Journal of Lightwave Technology, vol. 14, No. 8, pp. 1882-1898, (Aug. 1996).

Jinguji, K. and Oguma, M., "Optical Half-Band Filters," Journal of Lightwave Technology, vol. 18, No. 2, pp. 252-259, (Feb. 2000).

U.S. Appl. No. 14/702,294, filed May 1, 2015, Ahmed et al.

Kannan et al., "Analysis and Design of Active Optical Filter Structures With Two-Port Couplers," IEEE Journal of Lightwave Technology, vol. 24, No. 71, pp. 2637-2648, (Jul. 2006).

Leconte et al., "Analysis of Color-Center-Related Contribution to Bragg Grating Formation in Ge:SiO2 Fiber Based on a Local Kramers-Kronig Transformation of Excess Loss Spectra," Applied Optics, vol. 36, No. 24, pp. 5923-5930, (Aug. 20, 1997).

Little et al., "Microring Resonator Channel Dropping Filters," IEEE Journal of Lightwave Technology, vol. 15, No. 6, pp. 998-1005, (Jun. 1997).

Madsen, C., "Efficient Architectures for Exactly Realizing Optical Filters with Optimum Bandpass Designs," IEEE Photonics Technology Letters, vol. 10, No. 8, pp. 1136-1138, (Aug. 1998).

Madsen, C., "General IIR Optical Filter Design for WDM Applications Using All-Pass Filters," Journal of Lightwave Technology, vol. 18, No. 6, pp. 860-868, (Jun. 2000).

Nasu et al., "Low-Loss Waveguides Written with a Femtosecond Laser for Flexible Interconnection in a Planar Light-Wave Circuit," Optics Letters, vol. 30, No. 7, pp. 723-725, (Apr. 1, 2005).

Sefler, G., Conway, J., and Valley, G., "Wide-Bandwidth, High-Resolution ADC Scalable to Continuous-Time Operation," Conference on Lasers and Electro-Optics (CLEO), (2009).

Soref, R. and Bennett, B., "Kramers-Kronig Analysis of Electro-Optical Switching in Silicon," Integrated Optical Circuit Engineering IV, vol. 704, pp. 32-37, (Sep. 16-17, 1986).

Tropp et al., "Beyond Nyquist: Efficient Sampling of Sparse Bandlimited Signals", IEEE Transactions on Information Theory, vol. 56, No. 1, pp. 520-544, (Jan. 2010).

Valley et al., "Continuous Time Realization of Time-Stretch ADC," IEEE, International Topical Meeting on Microwave Photonics, pp. 1-3, (Oct. 2006).

Yariv, A., "Universal Relations for Coupling of Optical Power Between Microresonators and Dielectric Waveguides," Electronics Letters, vol. 36, No. 4, pp. 321-322, (Feb. 17, 2000).

From U.S. Appl. No. 12/131,088 (Now U.S. Pat. No. 8,019,185), Restriction/Election mailed on Jan. 12, 2009.

From U.S. Appl. No. 12/131,088 (Now U.S. Pat. No. 8,019,185), Non-Final Rejection mailed on Feb. 5, 2009.

(56) References Cited

OTHER PUBLICATIONS

From U.S. Appl. No. 12/131,088 (Now U.S. Pat. No. 8,019,185), Non-Final Rejection mailed on Jul. 29, 2009.
From U.S. Appl. No. 12/131,088 (Now U.S. Pat. No. 8,019,185), Final Rejection mailed on Jan. 4, 2010.
From U.S. Appl. No. 12/131,088 (Now U.S. Pat. No. 8,019,185), Non-Final Rejection mailed on Jul. 13, 2010.
From U.S. Appl. No. 12/131,088 (Now U.S. Pat. No. 8,019,185), Final Rejection mailed on Nov. 2, 2010.
From U.S. Appl. No. 12/131,088 (Now U.S. Pat. No. 8,019,185), Advisory Action mailed on Jan. 11, 2011.
From U.S. Appl. No. 12/131,088 (Now U.S. Pat. No. 8,019,185), Non-Final Rejection mailed on Jan. 26, 2011.
From U.S. Appl. No. 12/131,088 (Now U.S. Pat. No. 8,019,185), Notice of Allowance mailed on May 9, 2011.
From U.S. Appl. No. 12/183,064 (Now U.S. Pat. No. 8,331,743), Restriction/Election mailed on Jun. 15, 2011.
From U.S. Appl. No. 12/183,064 (Now U.S. Pat. No. 8,331,743), Non-Final Rejection mailed on Sep. 30, 2011.
From U.S. Appl. No. 12/183,064 (Now U.S. Pat. No. 8,331,743), Final Rejection mailed on Mar. 19, 2012.
From U.S. Appl. No. 12/183,064 (Now U.S. Pat. No. 8,331,743), Advisory Action mailed on Jul. 6, 2012.
From U.S. Appl. No. 12/183,064 (Now U.S. Pat. No. 8,331,743), Notice of Allowance mailed on Aug. 3, 2012.
From U.S. Appl. No. 12/560,409 (Now U.S. Pat. No. 8,270,792), Notice of Allowance mailed on May 22, 2012.
From U.S. Appl. No. 12/763,965 (Now U.S. Pat. No. 8,334,797), Non-Final Rejection mailed on Nov. 9, 2011.
From U.S. Appl. No. 12/763,965 (Now U.S. Pat. No. 8,334,797), Final Rejection mailed on Apr. 26, 2012.
From U.S. Appl. No. 12/763,965 (Now U.S. Pat. No. 8,334,797), Notice of Allowance mailed on Aug. 15, 2012.
From U.S. Appl. No. 13/114,594 (Now U.S. Pat. No. 8,244,077), Restriction/Election mailed on Sep. 8, 2011.
From U.S. Appl. No. 13/114,594 (Now U.S. Pat. No. 8,244,077), Non-Final Rejection mailed on Oct. 20, 2011.
From U.S. Appl. No. 13/114,594 (Now U.S. Pat. No. 8,244,077), Final Rejection mailed on Nov. 28, 2011.
From U.S. Appl. No. 13/114,594 (Now U.S. Pat. No. 8,244,077), Notice of Allowance mailed on Apr. 4, 2012.
Airola et al., "Experimental Demonstration of a Photonic Analog-to-Digital Converter Architecture With Pseudorandom Sampling," *IEEE Photonics Technology Letters*, vol. 20, No. 24, pp. 2171-2173, (Dec. 15, 2008).
Candes et al., "An Introduction to Compressive Sampling," *IEEE Signal Processing Magazine*, pp. 21-30, (Mar. 21, 2008).
Chen et al., "Sub-Nyquist Sampled Analog-to-Digital Conversion Based on Photonic Time Stretch and Compressive Sensing With Optical Random Mixing," *IEEE Journal of Lightwave Technology*, vol. 31, No. 21, pp. 3395-3401, (Nov. 1, 2013).
From U.S. Appl. No. 14/702,294 (Unpublished, Non-Publication Requested), Non-Final Rejection mailed on Feb. 18, 2016.

\* cited by examiner

CONTROLLABLE OPTO-ELECTRONIC TIME STRETCHER, AN ELECTRO-OPTICAL ANALOG TO DIGITAL CONVERTER HAVING NON-UNIFORM SAMPLING USING THE SAME, AND RELATED METHODS OF OPERATION

CROSS REFERENCE TO RELATED APPLICATIONS

This application claims the benefit of provisional application Ser. No. 61/988,133, entitled "A CONTROLLABLE OPTO-ELECTRONIC TIME STRETCHER, AN ELECTRO-OPTICAL ANALOG TO DIGITAL CONVERTER HAVING NON-UNIFORM SAMPLING USING THE SAME, AND RELATED METHODS OF OPERATION" and filed on May 2, 2014, which is hereby incorporated by reference.

This application claims the benefit of provisional application Ser. No. 62/147,493, entitled "A CONTROLLABLE OPTO-ELECTRONIC TIME STRETCHER, AN ELECTRO-OPTICAL ANALOG TO DIGITAL CONVERTER HAVING NON-UNIFORM SAMPLING USING THE SAME, AND RELATED METHODS OF OPERATION" and filed on Apr. 14, 2015, which is hereby incorporated by reference.

This application claims the benefit of provisional application Ser. No. 62/147,473, entitled "HARDWARE BASED COMPRESSIVE SAMPLING ADC ARCHITECTURE FOR NON-UNIFORM SAMPLED SIGNAL RECOVERY" and filed on Apr. 14, 2015, which is hereby incorporated by reference.

INCORPORATION BY REFERENCE

The present disclosure relates to U.S. Pat. No. 8,334,797, issued on Dec. 18, 2012 and entitled: "Wideband High Resolution Time-Stretched Photonic Analog-to-Digital Converter", which is hereby incorporated by reference.

REFERENCE TO A CONTRACT

This disclosure does not relate to work performed under a specific Government contract.

TECHNICAL FIELD

The present disclosure relates to electro-optic elements; in particular to an opto-electronic time stretcher for controllably stretching in time an optical pulse. The present disclosure also relates to an analog to digital converter using said opto-electronic time stretcher, as well as related methods of sampling an analog signal.

BACKGROUND

The resolution of Analog To Digital Converters, or ADCs, as measured by their effective number of bits (ENOB) is limited by their "aperture-jitter" at high sampling rates. Photonic time-stretching allows effective compression of the analog-input bandwidth, so that quantizers that sample at much lower rates fi can be used to accomplish A/D conversion with high resolution.

As documented in W. Ng, T. Rockwood, G. Sefler, G. Valley: "Demonstration of a Large Stretch-Ratio (M=41) Photonic Analog-to-Digital Converter with 8 ENOB for an Input Signal Bandwidth of 10 GHz", IEEE Photonic Technology Letters, Vol. 24 (14), 1185-1187 (2012), an ENOB >8 could be attained for $f_{sig}$=10 GHz with a Photonic Time Stretch ADC.

As illustrated in FIG. 1, a photonic TS ADC 10 comprises a source of light 12, such as a mode-locked laser, for generating a series of pulses having each a broad (~30-40 nm) supercontinuum (SC) spectrum.

FIG. 2 is a time-domain illustration of a series of pulses 13 comprising each a plurality of wavelengths. In FIG. 2, each exemplary pulse of light comprises four wavelengths of light represented on the figure by the symbols "Δ", "□", "○", and "*".

Returning to FIG. 1, ADC 10 comprises a first dispersion element 14 that chirps each pulse 13 by spreading in time the wavelengths comprised in the pulse. Dispersion element 14 can be made of a material the refractive index of which varies with wavelength, such that the wavelengths of the pulse traverse the material at different speeds and exit the material at different times. Dispersion element 14 is arranged so that the time-stretched optical pulses overlap with each other and dispersion element 14 outputs a continuous optical signal 16, comprised of wavelengths that periodically vary with time.

FIG. 3 is a time-domain illustration of the continuous optical signal 16 comprised of the overlapping juxtaposition of the time-spread optical pulses 13. Continuous optical signal 16 is comprised of various wavelengths, represented on the figure by the symbols "Δ", "□", "○", and "*", that periodically vary with time. The wavelength of a pulse 13 that gets out of dispersion element 14 the faster (represented by symbol "Δ" in FIG. 3) overlaps with the wavelength of the next pulse 13 that gets out of dispersion element 14 the slower (represented by symbol "*" in FIG. 3).

Returning to FIG. 1, ADC 10 comprises an electro-optic modulator 18 arranged for modulating continuous optical signal 16 with an input analog signal 20 into a modulated optical signal 22.

FIGS. 4 and 5 are time-domain illustrations of input analog signal 20 and modulated optical signal 22.

Returning to FIG. 1, ADC 10 comprises a time-controlled demultiplexer 24 arranged for separating the modulated optical signal 22 into a plurality of modulated optical signal segments 26. ADC 10 further comprises a plurality of second dispersion elements 28, coupled each to an output of demultiplexer 24, for spreading in time the wavelengths comprised in each modulated optical signal segment 26.

FIG. 6 is a time-domain illustration of a time-spread modulated optical signal segment 30 as output by a second dispersion element 28.

Returning to FIG. 1, ADC 10 comprises, coupled to the output of each second dispersion element 28, a sampler 32 arranged for sampling the time-spread modulated optical signal segments 30.

FIG. 7 is a time-domain illustration of a series of samples 34 obtained by sampling the time-spread modulated optical signal segment 30 as output by a second dispersion element 28.

Returning to FIG. 1, ADC 10 comprises a calculator 36 arranged for receiving the samples 34 output by each sampler 32, and for constructing a digitized image of the input analog signal 20 based on the samples 34.

If $D_1$ is the dispersion coefficient (given in psec/nm) of first dispersion element 14 and $D_2$ the dispersion coefficient of each dispersion element 28, the stretch ratio M of ADC 10 is given by: $M=1+D_2/D_1$. However, the number of channels in output of demultiplexer 24, which is needed to de-serialize an input-signal of continuous time-duration (CT) in ADC 10, is directly related to M. It follows that a stretch-factor M of 20 typically requires 20 or more parallel channels to de-serialize the signal. This, in turn, increases the size, weight and power consumption (SWAP) of the ADC.

There exists a need for a high resolution ADC having reduced size, weight and power consumption with respect to ADC 10.

SUMMARY OF THE INVENTION

The present disclosure relates to a controllable opto-electronic time stretcher, or dispersion element, that has a controllable dispersion. The present disclosure further relates to an electro-optical ADC that uses such controllable opto-electronic time stretcher to change the stretch ratio M of the ADC according to a predetermined non-uniform pattern, thus outputting a pseudo-randomly time stretched modulated optical signal; the ADC comprising a calculator capable of finding back the input signal of the ADC using said predetermined non-uniform pattern and periodic samples of the pseudo-randomly time stretched modulated optical signal.

An embodiment of the present disclosure comprises a controllable opto-electronic time stretcher having: a first wave guide and a second waveguide coupled to the first waveguide along a coupling portion; wherein at least one of the first and second waveguides in the coupling portion has a controllable refractive index.

According to an embodiment of the present disclosure, said at least one of the first and second waveguides in the coupling portion having controllable refractive index comprises an electro-optic portion and an electrode capable of submitting the electro-optic portion to a controllable electric field.

According to an embodiment of the present disclosure, said electro-optic portion comprises an electro-optic polymer or material.

According to an embodiment of the present disclosure, the first waveguide comprises a slot waveguide and the second waveguide comprises a strip waveguide.

According to an embodiment of the present disclosure, the first waveguide comprises a Si core and the second waveguide comprises a $Si_xN_y$ core; the first and second waveguides having a $SiO_2$ cladding.

According to an embodiment of the present disclosure, a layer of electro-optic material is arranged between the cores of the first and second waveguides in the coupling portion.

According to an embodiment of the present disclosure, said layer of electro-optic material is arranged in contact with the core of the first waveguide; the controllable opto-electronic time stretcher further comprising a tunnel layer of oxidized $Si_xN_y$ arranged in contact with the electro-optic material and a $SiO_2$ layer arranged between the tunnel layer and the core of the second waveguide.

An embodiment of the present disclosure comprises an electro-optical analog to digital converter having non-uniform sampling, having: a source of light arranged for generating at least one light pulse having a first spectral width; a chirp element arranged for spreading in time the wavelengths of said at least one light pulse; an electro-optic modulator arranged for modulating the time-spread light pulse with an input analog signal into a modulated optical signal; at least one controllable opto-electronic time stretcher according to concept 1 as detailed hereafter, arranged for receiving the modulated optical signal in the first wave guide and for controlling the refractive index according to a predetermined non-uniform pattern; at least one sampler arranged for sampling at a predetermined rate the output of the at least one controllable opto-electronic time stretcher; and a calculator arranged for constructing a digitized image of the input analog signal based on the samples generated by the at least one sampler and based on said predetermined non-uniform pattern.

According to an embodiment of the present disclosure, said source of light is arranged for generating said at least one light pulse as one light pulse of a train of identical light pulses; the chirp element being arranged to generate overlapping time-spread light pulses, and the electro-optic modulator being arranged to modulate the overlapping time-spread light pulses with an input analog signal into said modulated optical signal; the electro-optical analog to digital converter further comprises a time-controlled demultiplexer for separating said modulated optical signal into a plurality of modulated optical signal segments; said at least one controllable opto-electronic time stretcher comprises one controllable opto-electronic time stretcher for receiving each modulated optical signal segment in its first wave guide; said at least one sampler comprises one sampler for sampling the output of each controllable opto-electronic time stretcher; and said calculator is arranged for constructing a digitized image of the input analog signal based on the samples generated by each sampler, based on the order in which each modulated optical signal segment is generated by the demultiplexer, and based on said predetermined non-uniform pattern.

An embodiment of the present disclosure comprises a method for controllably time stretching an input optical signal; the method comprising: providing a first wave guide having a first refraction index characteristic, said first waveguide receiving said input optical signal; providing a second waveguide having a second refraction index characteristic; and coupling the second waveguide to the first waveguide with a controllable degree of coupling.

According to an embodiment of the present disclosure, coupling the second waveguide to the first waveguide with a controllable degree of coupling comprises controllably changing the refraction index of one of the first and second waveguide at a point of coupling between the first and second waveguides.

According to an embodiment of the present disclosure, said controllably changing the refraction index of one of the first and second waveguide comprises providing at least one of the first and second waveguides at said point of coupling with an electro-optic portion and submitting the electro-optic portion to a controllable electric field.

According to an embodiment of the present disclosure, said electro-optic portion comprises an electro-optic polymer.

According to an embodiment of the present disclosure, the first waveguide comprises a slot waveguide and the second waveguide comprises a strip waveguide.

According to an embodiment of the present disclosure, the first waveguide comprises a Si core, with a SiO2 inner core sandwiched by Si slabs, and the second waveguide comprises a $Si_xN_y$ core; the first and second waveguides having a $SiO_2$ cladding.

According to an embodiment of the present disclosure, said layer of electro-optic material is arranged between the cores of the first and second waveguides at the point of coupling.

According to an embodiment of the present disclosure, said layer of electro-optic material is arranged in contact with the core of the first waveguide; the controllable opto-electronic time stretcher further comprising a tunnel layer of oxidized $Si_xN_y$, arranged in contact with the electro-optic material and a $SiO_2$ layer arranged between the tunnel layer and the core of the second waveguide.

An embodiment of the present disclosure comprises a method of converting an analog input signal into a digital output signal, the method, comprising: generating at least one light pulse having a first spectral width; spreading in time the wavelengths of said at least one light pulse; modulating the time-spread light pulse with said input analog signal into a modulated optical signal; controllably time stretching the modulated optical signal according to the method of the previous concepts, said first waveguide receiving the modulated optical signal and said coupling with a controllable degree of coupling following a predetermined non-uniform pattern; sampling at a predetermined rate the output of the first and second waveguide; and constructing a digital output signal corresponding to a digitized image of the analog input signal, based on the samples generated by the sampling and based on said predetermined non-uniform pattern.

According to an embodiment of the present disclosure, said generating at least one light pulse comprises generating said at least one light pulse as one light pulse of a train of identical light pulses; said spreading in time the wavelengths of said at least one light pulse comprises generating overlapping time-spread light pulses; said modulating the time-spread light pulse comprises modulating the overlapping time-spread light pulses with said input analog signal into said modulated optical signal; the method further comprising separating said modulated optical signal into a plurality of successive modulated optical signal segments; wherein said controllably time stretching the modulated optical signal according to the method of the previous concepts comprises controllably time stretching separately each of the successive modulated optical signal segments by varying, according to said predetermined non-uniform pattern, a coupling between a first waveguide receiving each modulated optical signal segment and a second waveguide; wherein said sampling at a predetermined rate the output of the first and second waveguides comprises sampling each time-stretched modulated optical signal segment at said predetermined rate; and wherein said constructing a digital output signal comprises constructing a digitized image of the input analog signal based on the samples generated for each time-stretched modulated optical signal segment, based on the order in which each time-stretched modulated optical signal segment is generated, and based on said predetermined non-uniform pattern.

An embodiment of the present disclosure comprises a method of sampling an analog signal having a predetermined spectrum, the method comprising: assuming that said analog signal corresponds to a K sparse vector of N coefficients, with K<<N; spreading in time said analog signal according to a predetermined pseudo-random pattern into a pseudo-randomly time-spread signal; on a predetermined time period, taking M samples by sampling the pseudo-randomly time-spread signal at a predetermined rate, said predetermined rate being inferior to the Nyquist rate, where M≥K.log(N/K); associating the M samples to the time at which they would have been taken if said analog signal had been spread uniformly during said time period by a spread factor equal to the mean of the pseudo-randomly spread factor on said time period; and determining iteratively the closest output signal that would have allowed extracting the M samples at their associated times.

According to an embodiment of the present disclosure, the method comprises: assuming that the analog signal can be expressed as a K sparse vector comprising a number N of DFT coefficients, with K<<N; assuming that the set Y of M samples is such that Y=Φ.X (1), where Φ is a M by N matrix; assuming that X can be written as X=Ψ.S (2), where Ψ is a N×N matrix and S is a N-coefficients vector having only K non-zero coefficients, whereby Y=θ.S, with θ=Φ.Ψ; solving the linear program: Ŝ=argmin∥S∥₁, subject to Y=θ.S, where $$\|S\|_1 = \sum_{k=1}^{N} |S(k)|;$$

and finding X using X=Ψ.S.

An embodiment of the present disclosure comprises an electro-optical analog to digital converter having non-uniform sampling, having: a source of light arranged for generating at least one light pulse having a first spectral width; a chirp element arranged for spreading in time the wavelengths of said at least one light pulse; an electro-optic modulator arranged for modulating the time-spread light pulse with an input analog signal into a modulated optical signal; at least one controllable opto-electronic time stretcher arranged for variably spreading in time the modulated optical signal according to a predetermined non-uniform pattern; at least one sampler arranged for sampling at a predetermined rate the output of the at least one controllable opto-electronic time stretcher; and a calculator arranged for constructing a digitized image of the input analog signal based on the samples generated by the at least one sampler and based on said predetermined non-uniform pattern.

According to an embodiment of the present disclosure, said source of light is arranged for generating said at least one light pulse as one light pulse of a train of identical light pulses; the chirp element being arranged to generate overlapping time-spread light pulses, and the electro-optic modulator being arranged to modulate the overlapping time-spread light pulses with an input analog signal into said modulated optical signal; the electro-optical analog to digital converter further comprises a time-controlled demultiplexer for separating said modulated optical signal into a plurality of modulated optical signal segments; said at least one controllable opto-electronic time stretcher comprises one controllable opto-electronic time stretcher for variably spreading in time according to a predetermined non-uniform pattern each modulated optical signal segment; said at least one sampler comprises one sampler for sampling the output of each controllable opto-electronic time stretcher; and said calculator is arranged for constructing a digitized image of the input analog signal based on the samples generated by each sampler, based on the order in which each modulated optical signal segment is generated by the demultiplexer, and based on said predetermined non-uniform pattern.

According to an embodiment of the present disclosure, the controllable opto-electronic time stretcher comprises: a first wave guide; and a second waveguide coupled to the first waveguide along a coupling portion; wherein at least one of the first and second waveguides in the coupling portion has a controllable refractive index.

According to an embodiment of the present disclosure, said at least one of the first and second waveguides in the coupling portion having controllable refractive index comprises an electro-optic portion and an electrode capable of submitting the electro-optic portion to a controllable electric field.

According to an embodiment of the present disclosure, said electro-optic portion comprises an electro-optic polymer.

According to an embodiment of the present disclosure, the first waveguide comprises a slot waveguide and the second waveguide comprises a strip waveguide.

According to an embodiment of the present disclosure, the first waveguide comprises a Si core and the second waveguide comprises a $Si_xN_y$ core; the first and second waveguides having a $SiO_2$ cladding.

According to an embodiment of the present disclosure, said electro-optic portion is arranged between the cores of the first and second waveguides in the coupling portion.

According to an embodiment of the present disclosure, said electro-optic portion is arranged in contact with the core of the first waveguide; the controllable opto-electronic time stretcher further comprising a tunnel layer of oxidized $Si_xN_y$ arranged in contact with the electro-optic material and a $SiO_2$ layer arranged between the tunnel layer and the core of the second waveguide.

An embodiment of the present disclosure comprises a method of converting an analog input signal into a digital output signal, the method, comprising: generating at least one light pulse having a first spectral width; spreading in time the wavelengths of said at least one light pulse; modulating the time-spread light pulse with said input analog signal into a modulated optical signal; controllably time stretching the modulated optical signal according to a predetermined non-uniform pattern; sampling at a predetermined rate the output of the first and second waveguide; and constructing a digital output signal corresponding to a digitized image of the analog input signal, based on the samples generated by the sampling and based on said predetermined non-uniform pattern.

According to an embodiment of the present disclosure, said generating at least one light pulse comprises generating said at least one light pulse as one light pulse of a train of identical light pulses; said spreading in time the wavelengths of said at least one light pulse comprises generating overlapping time-spread light pulses; said modulating the time-spread light pulse comprises modulating the overlapping time-spread light pulses with said input analog signal into said modulated optical signal; the method further comprising separating said modulated optical signal into a plurality of successive modulated optical signal segments; wherein said controllably time stretching the modulated optical signal comprises controllably time stretching separately each of the successive modulated optical signal segments according to said predetermined non-uniform pattern; wherein said sampling at a predetermined rate the output of the first and second waveguides comprises sampling each time-stretched modulated optical signal segment at said predetermined rate; and wherein said constructing a digital output signal comprises constructing a digitized image of the input analog signal based on the samples generated for each time-stretched modulated optical signal segment, based on the order in which each time-stretched modulated optical signal segment is generated, and based on said predetermined non-uniform pattern.

According to an embodiment of the present disclosure, said controllably time stretching the modulated optical signal comprises: providing a first wave guide having a first refraction index characteristic, said first waveguide receiving said input optical signal; providing a second waveguide having a second refraction index characteristic; and coupling the second waveguide to the first waveguide with a controllable degree of coupling.

According to an embodiment of the present disclosure, coupling the second waveguide to the first waveguide with a controllable degree of coupling comprises controllably changing the refraction index of one of the first and second waveguide at a point of coupling between the first and second waveguides.

According to an embodiment of the present disclosure, said controllably changing the refraction index of one of the first and second waveguide comprises providing at least one of the first and second waveguides at said point of coupling with an electro-optic portion and submitting the electro-optic portion to a controllable electric field.

According to an embodiment of the present disclosure, said electro-optic portion comprises an electro-optic polymer.

According to an embodiment of the present disclosure, the first waveguide comprises a slot waveguide and the second waveguide comprises a strip waveguide.

According to an embodiment of the present disclosure, the first waveguide comprises a Si core and the second waveguide comprises a $Si_xN_y$ core; the first and second waveguides having a $SiO_2$ cladding.

According to an embodiment of the present disclosure, said layer of electro-optic material is arranged between the first and second waveguides cores at the point of coupling.

According to an embodiment of the present disclosure, said layer of electro-optic material is arranged in contact with the core of the first waveguide; the controllable opto-electronic time stretcher further comprising a tunnel layer of oxidized $Si_xN_y$ arranged in contact with the electro-optic material and a $SiO_2$ layer arranged between the tunnel layer and the core of the second waveguide.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1:
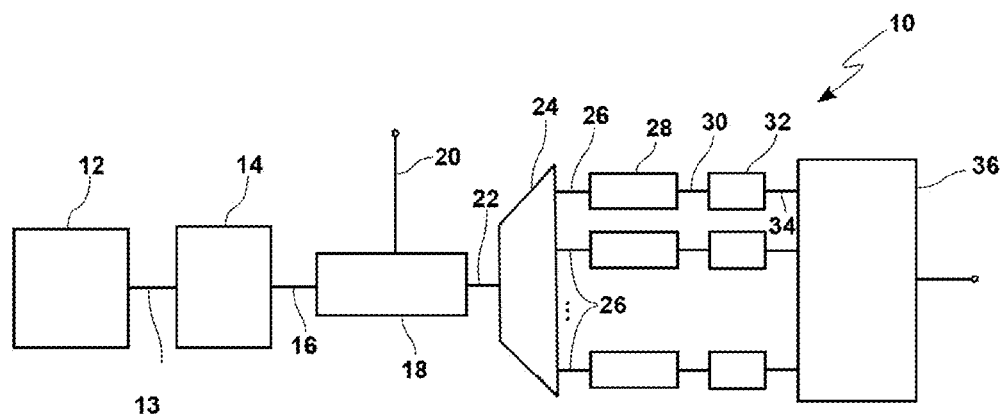
FIG. 1 illustrates a known Photonic Analog-to-Digital Converter.
Figure 2:
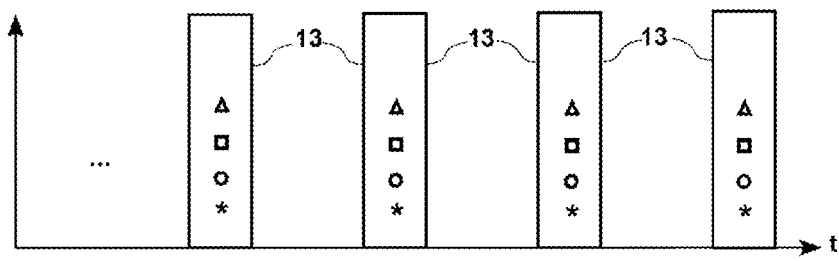
FIG. 2 illustrates a series of pulses output by the source of light of FIG. 1.
Figure 3:
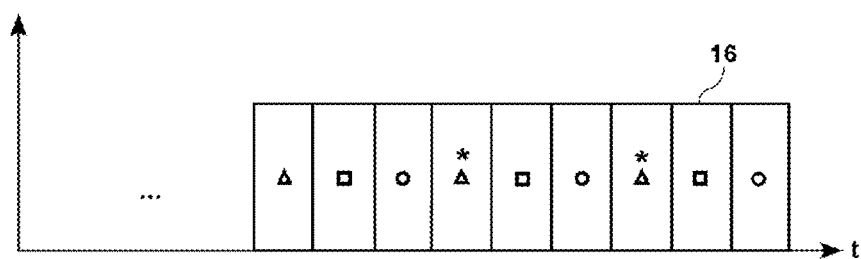
FIG. 3 illustrates a continuous optical signal provided to the optical input of the modulator of FIG. 1.
Figure 4:
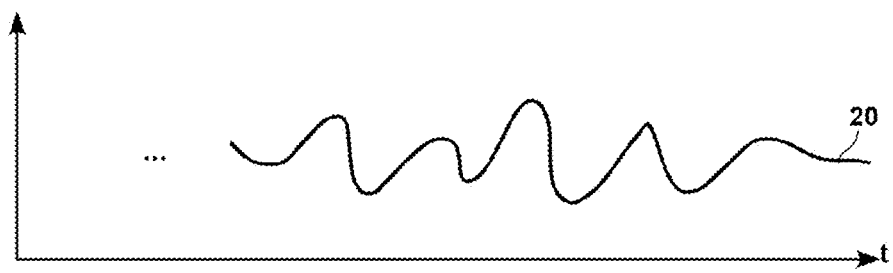
FIG. 4 illustrates an input analog signal provided to the electrical input of the modulator of FIG. 1.
Figure 5:
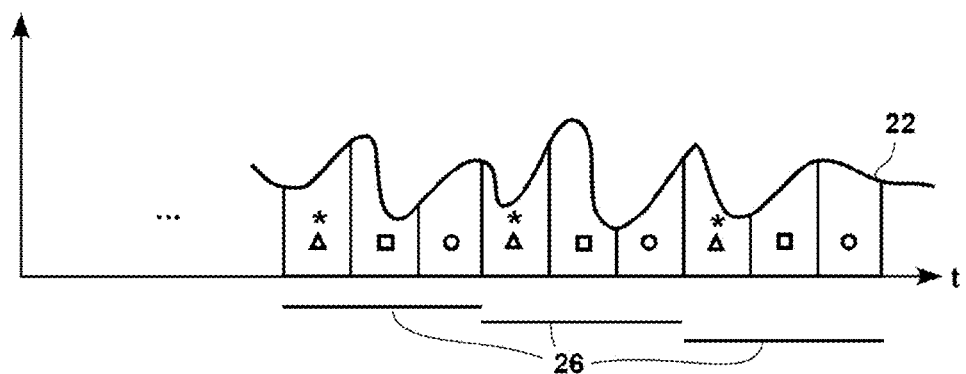
FIG. 5 illustrates the signal output by the modulator of FIG. 1.
Figure 8:
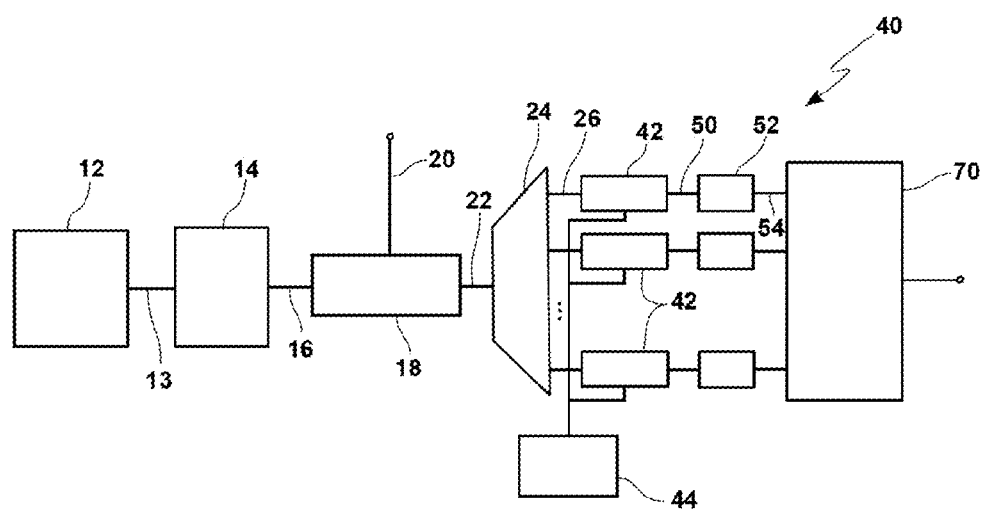
FIG. 8 illustrates a Photonic Analog-to-Digital Converter according to an embodiment of the present disclosure.

FIG. 8 illustrates a Photonic Analog-to-Digital Converter 40 according to an embodiment of the present disclosure. According to an embodiment of the present disclosure, ADC 40 comprises a source of light 12, a first dispersion element 14, an electro-optic modulator 18 and a demultiplexer 24 arranged and operating as in the ADC 10 of FIG. 1. FIGS. 2, 3 and 5 can respectively be used to illustrate the outputs of source of light 12, first dispersion element 14, and electro-optic modulator 18 of ADC 40 as detailed above with respect to ADC 10.

According to an embodiment of the present disclosure, in ADC 40, each output of demultiplexer 24 is coupled to a controllable time stretcher 42 that has a controllable dispersion. The structure of an exemplary time stretcher is detailed hereafter. Demultiplexer 24 is time controlled for slicing the modulated optical signal 22 into a plurality of modulated optical signal segments 26, such that each controllable time stretcher 42 receives in input a different one of the plurality of modulated optical signal segments 26. According to an embodiment of the present disclosure, each controllable time stretcher 42 is controlled by a source 44 of a predetermined non-uniform or pseudo-random pattern, such that the dispersion of each controllable time stretcher 42 is changed in time according to said pseudo-random pattern as the modulated optical signal segment 26 received by the controllable time stretcher 42 passes through the controllable time stretcher 42. This results in spreading in time modulated optical signal segment 26 with a pseudo-random time-stretching factor controlled by source 44.

Figure 6:
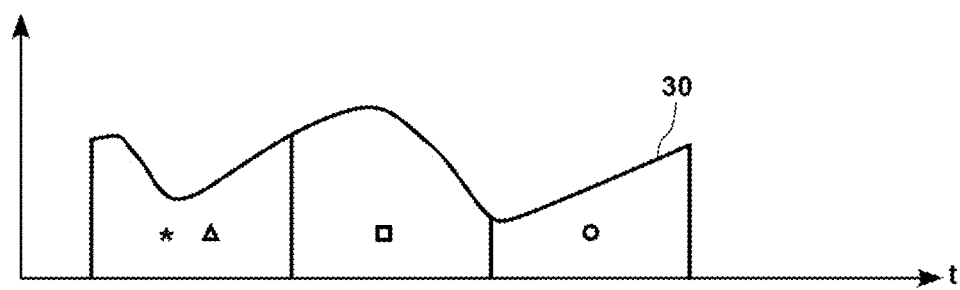
FIG. 6 illustrates the signal provided to a sampler of FIG. 1.
Figure 9:
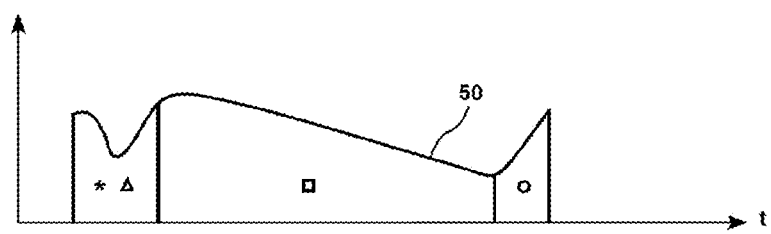
FIG. 9 illustrates the signal provided to a sampler of FIG. 8.

FIG. 9 is a time-domain illustration of a pseudo-randomly time-spread modulated optical signal segment 50 as output by a controllable time stretcher 42. Pseudo-randomly time-spread modulated optical signal segment 50 is to be compared with a regularly time-spread modulated optical signal segment 30 such as shown in FIG. 6. In the exemplary pseudo-randomly time-spread modulated optical signal segment 50 of FIG. 9, the first and last portions of signal segment 26, having the wavelengths represented by "Δ", "*" and "○", were time-spread less than the same portion of signal in FIG. 6, and the middle portion of signal segment 26, having the wavelengths represented by "□", was time-spread more than the same portion of signal in FIG. 6. According to an embodiment of the present disclosure, signal segment 50 is presented to a sampler 52 having a fixed predetermined sampling rate.

Figure 10:
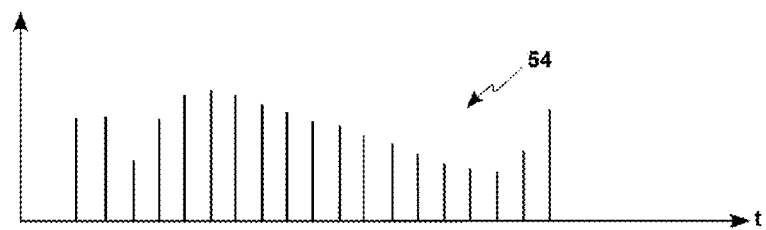
FIG. 10 illustrates the signal output by a sampler of FIG. 8.

FIG. 10 is a time-domain illustration of a series of samples 54 obtained by sampling the pseudo-randomly time-spread modulated optical signal segment 50 of FIG. 9, as output by a sampler 52. According to an embodiment of the present disclosure, because the samples 54 are taken at a fixed sampling rate from a pseudo-randomly time-stretched signal, samples 54 are identical to samples that would be taken at a pseudo-random sampling rate from a signal time-stretched with a fixed time-stretch factor. Sampler 52 can be a photodetector/photoreceiver.

Figure 7:
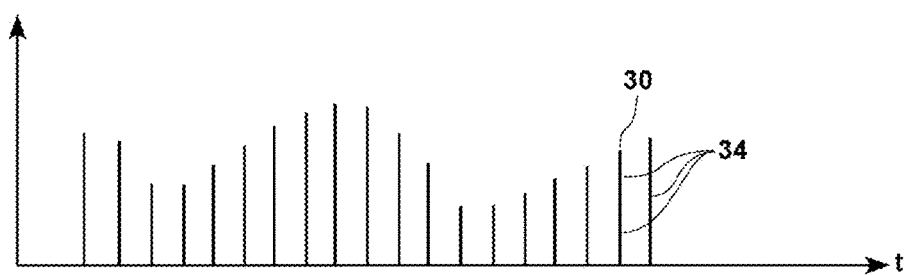
FIG. 7 illustrates the signal output by a sampler of FIG. 1.
Figure 11:
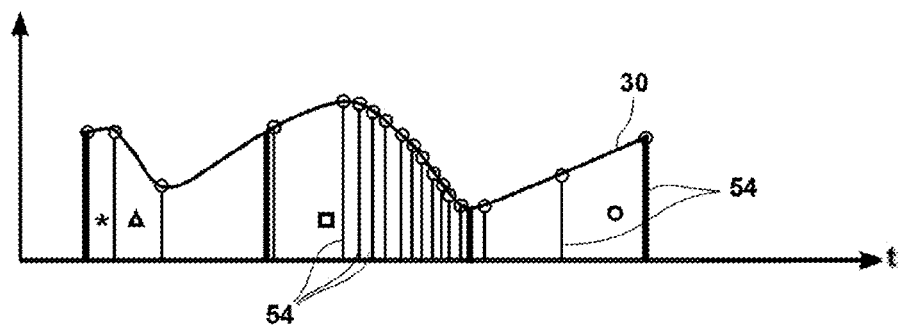
FIG. 11 illustrates the effect of controllably varying the stretch ratio M of the ADC of FIG. 8 on the sampling of the time-stretched optical signal.

FIG. 11 illustrates the position in time of samples 54 of FIG. 10 with respect to a time-spread modulated optical signal segment 30 as output by a second dispersion element 28 having a fixed time-stretch factor. FIG. 11 is to be compared to FIG. 7. Fewer samples were taken from the portions of signal segment 26 having the wavelengths represented by "Δ", "*" and "○" in FIG. 11 than in FIG. 7. On another hand, much more samples were taken from the middle portion of signal segment 26, having the wavelengths represented by "□", in FIG. 11 than in FIG. 7. The inventors have noted that, even for a total number of samples of a signal that would lead to sub-sampling and aliasing if the samples were taken at a fixed rate, taking the same number of samples of a signal at a pseudo-random sampling rate allows eliminating aliasing.

Figure 12A:
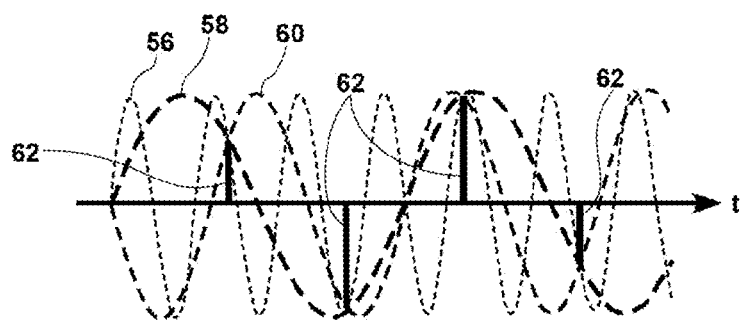
FIG. 12A illustrates signal aliasing when using uniform sampling.

FIG. 12A is a time-domain illustration of a plurality of exemplary sinusoidal signals 56, 58, 60 having different frequencies, which cannot be differentiated by a series of samples 62 taken at a fixed, sub-sampling, rate from signal 58.

Figure 12B:
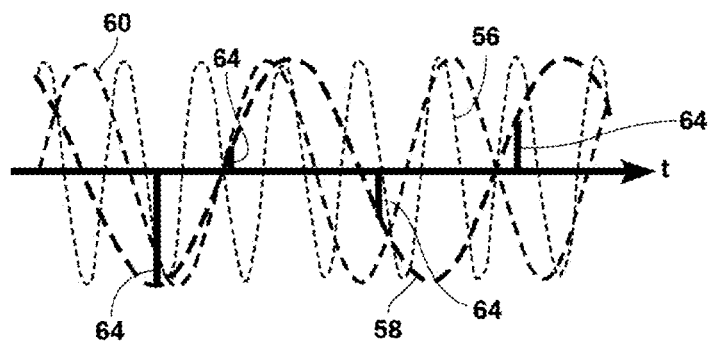
FIG. 12B illustrates signal aliasing reduction when using non-uniform sampling.

FIG. 12B is a time-domain illustration of the signals 56, 58, 60 of FIG. 12A having different frequencies, which can be differentiated by a series of samples 64 of signal 58, comprising as many samples as samples 62 but taken at a pseudo-random sampling rate.

Figure 13:
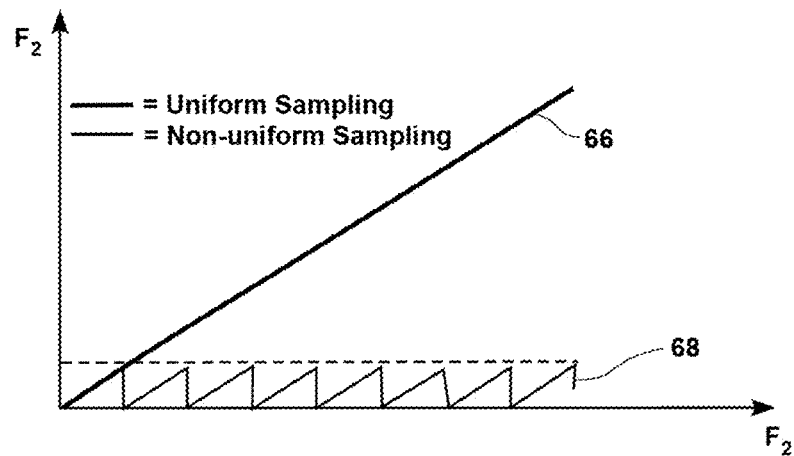
FIG. 13 illustrates the elimination of sub-sampled aliases via non-uniform sampling.

FIG. 13 illustrates the measured/recovered frequency Fr for an input frequency Fi as recovered 66 using non-uniformly (pseudo-randomly) sub-sampled signals, as well as the measured/recovered frequency Fr for an input frequency Fi as recovered 68 using uniformly sampled signals. As shown in FIG. 13, frequency Fr recovered 68 from a uniform sampling is folded back into the first Nyquist zone capped at half the frequency of the uniform sampling.

According to an embodiment of the present disclosure, non-uniform/pseudo-random sampling of signals 26 allows recovering signal 26 with a smaller number of samples than with a regular sampling. Alternatively, with a number of samples unchanged non-uniform/pseudo-random sampling of signals 26 according to an embodiment of the present disclosure allows efficiently sampling signals 26 that are less time-stretched than if signals 26 were to be uniformly sampled, which in turn reduces the number of signals 26 that need be formed out of modulated signal 22. This in turn reduces the size of multiplexer 24 as well as the number of controllable time stretchers 42 and samplers 52 in Photonic Analog-to-Digital Converter 40.

According to an embodiment of the present disclosure, the input signal 26 from which non-uniform/pseudo-random samples 54 are taken can be reconstructed by a calculator 70, arranged for constructing a digitized image of the input analog signal 20 based on the samples 54 as well as the output of pseudo-random pattern source 44.

According to an embodiment of the present disclosure, the digitized image X of input analog signal 20, for example the Discrete Fourier Transform of signal 20, is reconstructed by considering the set Y of samples 54 as a compressive-sensing measurement of X. Considering that Y comprises M samples, and X comprises N coefficients, with M<<N, it can be written that $$Y = \Phi \cdot X \qquad (1),$$

where Φ is a M by N matrix. Compressive sensing is for example described in: R. Baraniuk, "Compressive Sensing", IEEE Signal Processing Magazine, p.118-124, July, 2007.

According to an embodiment of the present disclosure it is considered that X is K-sparse, whereby X can be written as $$X = \Psi.S \qquad (2),$$

where $\Psi$ is a N×N matrix and S is a N-coefficients vector having only K non-zero coefficients.

The above equations (1) and (2) lead to the hypothesis that $$Y = \theta.S \qquad (3),$$

with $\theta = \Phi.\Psi$.

Figure 14:
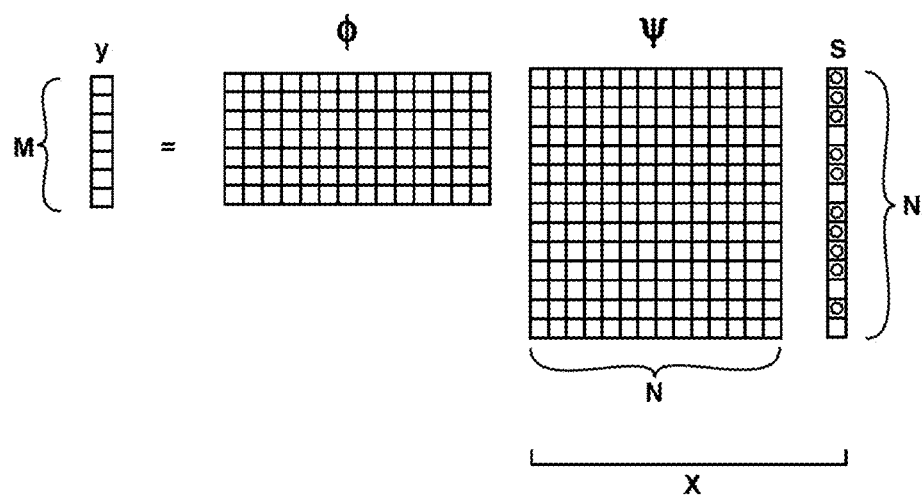
FIG. 14 illustrates a method followed for reconstructing the input signal from the samples taken according to an embodiment of the present disclosure.

FIG. 14A illustrates equation (3) above in an exemplary case where S comprises K=4 non-zero coefficients.

It has been shown that, if M≥K.log(N/K), and matrix Φ is a "random" measurement-matrix, the s vector of equation (3) above can be found by solving the linear program:

$$\hat{S} = \operatorname{argmin}|S|_l, \text{ subject to } Y = \theta.S \qquad (4)$$

where $$\|S\|_1 = \sum_{k=1}^{N} |S(k)|$$

Such linear program is for example disclosed in: J. Tropp and S. J. Wright, "Computational methods for sparse solution of linear inverse problems," Proc. IEEE, 98(6): 948-958, 2010. According to an embodiment of the present disclosure, X is then found back using $X = \Psi.S$.

According to embodiments of the present disclosure, other signal reconstruction algorithms such as orthogonal matching pursuit that can also be used to find the sparse vector s and the input signal X.

According to an embodiment of the present disclosure, knowledge of the pseudo-random pattern generated by source 44 allows associating samples 54 each to the pseudo-random position in time they would have in a time-spread modulated optical signal segment 30 as shown in FIG. 11, whereby the set Y of samples 54 can be considered as a non-uniform sampling of segment 30. An embodiment of the present disclosure provides for finding the combination of DFT coefficients that allow reconstructing a signal X as close as possible to segment 30. According to an embodiment of the present disclosure, because the set Y of samples 54 having pseudo-random positions in time can be considered as a non-uniform sampling of segment 30, the number of samples 54 can be smaller than the number of samples that would be required by Nyquist-Shannon, and still allow reconstruction of signal X. Calculator 70 can be implemented as a processor programmed to retrieve signal X from samples Y, or as a FPGA or a custom-made integrated circuit having calculation modules for retrieving signal X from samples Y.

Figure 15:
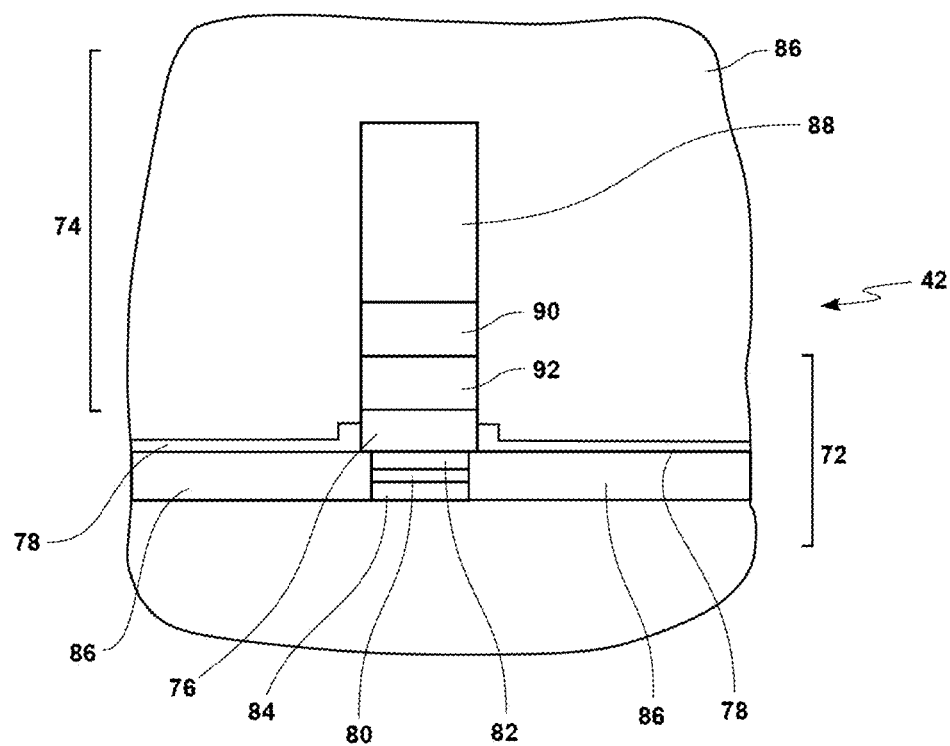
FIG. 15 illustrates the refractive index of the coupling portion of a controllable opto-electronic time stretcher according to an embodiment of the present disclosure.

FIG. 15 shows a cross section in a plane perpendicular to the light propagation axis of controllable time stretcher 42 according to an embodiment of the present disclosure. Time stretcher 42 comprises a first wave guide 72; a second waveguide 74 coupled to the first waveguide along a coupling portion cut by the plane of the cross-section. According to an embodiment of the present disclosure, at least one of the first and second waveguides in the coupling portion has a controllable refractive index. In the exemplary embodiment of FIG. 15, first wave guide 72 in the coupling portion has a controllable refractive index.

According to an embodiment of the present disclosure, first wave guide 72 comprises an electro-optic portion 76, for example comprising an electro-optic polymer, and an electrode 78 capable of submitting the electro-optic portion 76 to a controllable electric field, to controllably change the refractive index of first wave guide 72. According to an embodiment of the present disclosure, first waveguide 72 is a slot waveguide, provided for guiding strongly confined light in a subwavelength-scale low refractive index region 80 by total internal reflection. According to an embodiment of the present disclosure, first waveguide 72 comprises a core having two strips or slabs 82, 84 of high-refractive-index materials separated by subwavelength-scale low-refractive-index slot inner core region 80. A portion of core region 82 is covered by electro-optic portion 76. The remaining portions of the core regions 80, 82, 84 are covered by low-refractive-index cladding materials 86 having a refractive index comparable to the refractive index of portion 76.

According to an embodiment of the present disclosure, second waveguide 74 is a buried strip waveguide comprising a core slab 88. According to an embodiment of the present disclosure, core slab 88 can be separated from electro-optic portion by a thin slab 90 of cladding material, followed by a thin tunnel layer slab 92. According to an embodiment of the present disclosure, the remaining portions of core slab 88 can be covered by a thick layer of cladding material 86.

According to an embodiment of the present disclosure, the first waveguide 72 comprises a SiO2 core 80 sandwiched by Si slabs 82, 84; the total height of the core regions 84, 80, 82 being 0.245 μm and their width being 0.5 μm. Cladding 86 can be $SiO_2$. Tunnel layer slab 92 can be Oxy-$SixN_y$, and core 88 can be a $Si_xN_y$ core having a height of 1 μm. The height of the layer 76 of the electro optic polymer can be equal to the height of the tunnel layer slab 92 and be 0.245 μm. The height of the thin cladding material slab 90 and be 0.4 μm. The width of all the slabs can be 0.5 μm.

It is noted that the exemplary embodiment illustrated in FIG. 15 shows a first waveguide 72 having an electro-optic portion 76 for controlling the refractive index of the first waveguide; but according to an embodiment of the present disclosure, waveguide 72 can also comprise a thermo-optic portion 76 for controlling the refractive index of the first waveguide. In such embodiment, electrode 78 would end with resistors for increasing the temperature of thermo-optic portion 76, and could alternatively be used as heat drains for decreasing the temperature of thermo-optic portion 76. A metal plate can alternatively surround the coupling potion of the waveguides to evacuate the heat.

The exemplary embodiment illustrated in FIG. 15 shows a first waveguide 72 having a electro-optic portion 76 for controlling the refractive index of the first waveguide; but according to an embodiment of the present disclosure, the second waveguide can alternatively comprise a thermo-optic portion for controlling its refractive index. According to an embodiment of the present disclosure, the light can be input into controllable time stretcher 42 through only one of waveguides 72, 74, or both of them.

According to an embodiment of the present disclosure, first waveguide 72 has a first refractive index n1, which changes with the wavelength λ of the light propagating through first waveguide 72, and second waveguide 74 has a second refractive index n2, which changes with the wavelength λ of the light propagating through first waveguide 74.

Figure 16:
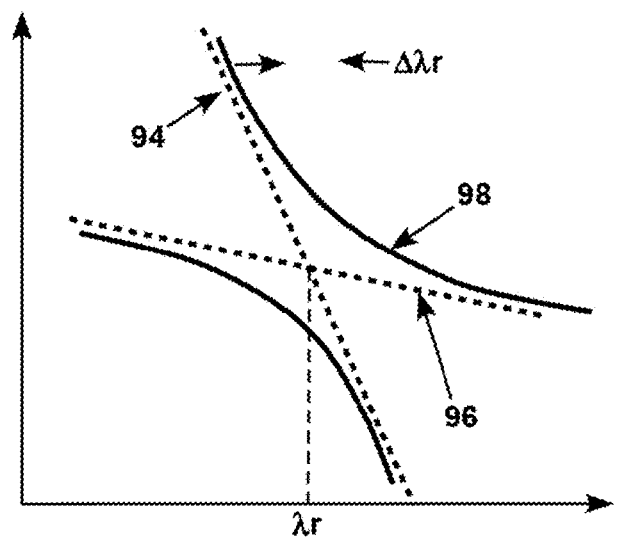
FIG. 16 illustrates the dispersion enhancement over the resonance width of the time stretcher of FIG. 16.

FIG. 16 is a diagram showing how refractive indexes n1 and n2 change, respectively along a line 94 having a strong decreasing slope and a line 96 having a weaker decreasing slope. Lines 94 and 96 cross at a resonance wavelength λr. According to an embodiment of the present disclosure, the refractive index n3 of the coupling region of first and second waveguides 72, 74 follows a curve 98 essentially above and tangent to the highest of lines 94-96. According to an embodiment of the present disclosure, at the coupling region of first and second waveguides 72, 74, the light having a wavelength below λr propagates in first waveguide 72 and the light having a wavelength above λr propagates in second waveguide 74. According to an embodiment of the present disclosure, the light having a wavelength comprised within a range Δλr propagates in both the first and the second waveguides. According to an embodiment of the present disclosure, Δλr can be 21 nm wide.

According to an embodiment of the present invention, first and second waveguides 72, 74 are provided for having each a reduced dispersion. The inventors have noted that the dispersion at the coupling region of first and second waveguides 72, 74 is very high for light having a wavelength comprised within the range Δλr.

Figure 17:
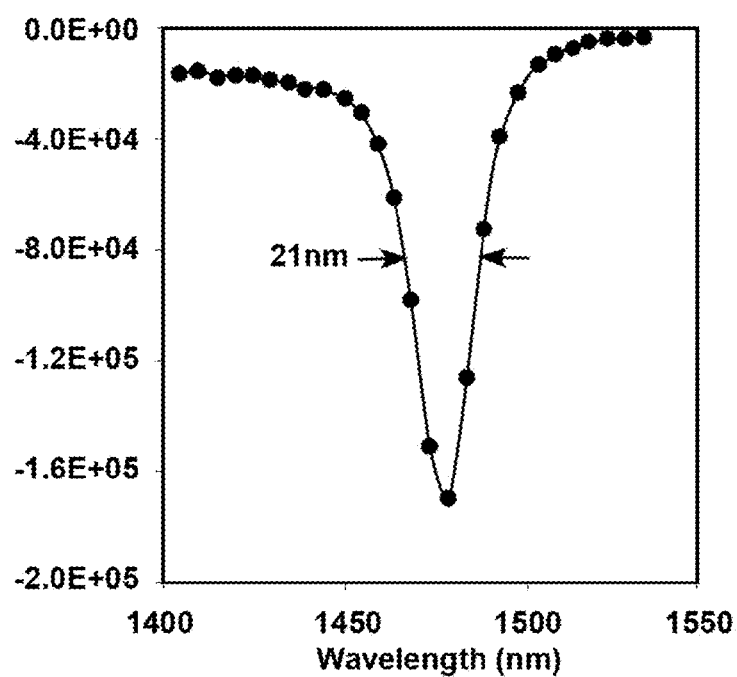
FIG. 17 illustrates a cross-section of an embodiment of the time stretcher of FIG. 16.

FIG. 17 illustrates the dispersion at the coupling region of first and second waveguides 72, 74: generally small but very high for light having a wavelength comprised within the range Δλr.

According to an embodiment of the present disclosure, changing the degree of coupling between waveguides 72 and 74 changes the values of λr and Δλr. An embodiment of the present disclosure provides for changing the degree of coupling, by changing the refractive index of waveguide 72, for example by controllably changing the refractive index of region 76, which changes the slope or position of line 94 of FIG. 16, thus changing the values of λr and Δλr.

Referring back to FIG. 5, it is noted that each signal segment 26 is comprised of a plurality of wavelengths represented by "Δ", "□", "○", "*". According to an embodiment of the present invention, controllable time stretcher 42 is arranged such that controllably changing the refractive index of region 76 causes Δλr to controllably sweep the wavelengths represented by "Δ", "□", "○", "*" of each signal segment 26. This can cause the dispersion/time stretch in controllable time stretcher 42 to increase strongly for a controlled portion of signal segment 26 if the wavelength ("Δ", "□", "○", "*") of said portion is comprised in the range Δλr at the time said portion passes through time stretcher 42.

According to an embodiment of the present disclosure, the control electrodes 78 of controllable time stretcher 42 receive a control voltage that follows a predetermined pseudo-random pattern from source 44, such that the dispersion of each controllable time stretcher 42 is changed in time according to said pseudo-random pattern as the modulated optical signal segment 26 received by the controllable time stretcher 42 passes through the controllable time stretcher 42. According to an embodiment of the present disclosure, this allows spreading in time the modulated optical signal segment 26 with a pseudo-random time-stretching factor controlled by source 44.

According to an embodiment of the present invention, the average stretch factor introduced by controllable time stretcher 42 must not be larger than the number of modulated optical signal segments 26 produced by demultiplexer 24.

Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

The present disclosure discloses the following concepts:

1. A controllable opto-electronic time stretcher comprising:
   a first wave guide;
   a second waveguide coupled to the first waveguide along a coupling portion;
   wherein at least one of the first and second waveguides in the coupling portion has a controllable refractive index.

2. The controllable opto-electronic time stretcher of concept 1, wherein said at least one of the first and second waveguides in the coupling portion having a controllable refractive index comprises an electro-optic portion and an electrode capable of submitting the electro-optic portion to a controllable electric field.

3. The controllable opto-electronic time stretcher of concept 2, wherein said electro-optic portion comprises an electro-optic polymer.

4. The controllable opto-electronic time stretcher of concept 2, wherein the first waveguide comprises a slot waveguide and the second waveguide comprises a strip waveguide.

5. The controllable opto-electronic time stretcher of concept 4, wherein the core of the first waveguide comprises a SiO2 inner core sandwiched by Si slabs and the second waveguide comprises a $Si_xN_y$ core; the first and second waveguides having a $SiO_2$ cladding.

6. The controllable opto-electronic time stretcher of concept 5, wherein said layer of electro-optic material is arranged between the first and second waveguides cores in the coupling portion.

7. The controllable opto-electronic time stretcher of concept 6, wherein said layer of electro-optic material is arranged in contact with the core of the first waveguide; the controllable opto-electronic time stretcher further comprising a tunnel layer of oxidized $Si_xN_y$ arranged in contact with the electro-optic material and a $SiO_2$ layer arranged between the tunnel layer and the core of the second waveguide.

8. An electro-optical analog to digital converter having non-uniform sampling, comprising:
   a source of light arranged for generating at least one light pulse having a first spectral width;
   a chirp element arranged for spreading in time the wavelengths of said at least one light pulse;
   an electro-optic modulator arranged for modulating the time-spread light pulse with an input analog signal into a modulated optical signal;
   at least one controllable opto-electronic time stretcher according to concept 1, arranged for receiving the modulated optical signal in the first wave guide and for controlling the refractive index according to a predetermined non-uniform pattern;

at least one sampler arranged for sampling at a predetermined rate the output of the at least one controllable opto-electronic time stretcher; and a calculator arranged for constructing a digitized image of the input analog signal based on the samples generated by the at least one sampler and based on said predetermined non-uniform pattern.

9. The electro-optical analog to digital converter having non-uniform sampling of concept 8:

wherein said source of light is arranged for generating said at least one light pulse as one light pulse of a train of identical light pulses; the chirp element being arranged to generate overlapping time-spread light pulses, and the electro-optic modulator being arranged to modulate the overlapping time-spread light pulses with an input analog signal into said modulated optical signal;

wherein the electro-optical analog to digital converter further comprises a time-controlled demultiplexer for separating said modulated optical signal into a plurality of modulated optical signal segments;

wherein said at least one controllable opto-electronic time stretcher comprises one controllable opto-electronic time stretcher for receiving each modulated optical signal segment in its first wave guide wherein said at least one sampler comprises one sampler for sampling the output of each controllable opto-electronic time stretcher; and wherein said calculator is arranged for constructing a digitized image of the input analog signal based on the samples generated by each sampler, based on the order in which each modulated optical signal segment is generated by the demultiplexer, and based on said predetermined non-uniform pattern.

10. A method for controllably time stretching an input optical signal; the method comprising:

providing a first wave guide having a first refraction index characteristic, said first waveguide arranged for receiving said input optical signal;

providing a second waveguide having a second refraction index characteristic; and coupling the second waveguide to the first waveguide with a controllable degree of coupling.

11. The method of concept 10, wherein coupling the second waveguide to the first waveguide with a controllable degree of coupling comprises controllably changing the refraction index of one of the first and second waveguide at a point of coupling between the first and second waveguides.

12. The method of concept 11, wherein said controllably changing the refraction index of one of the first and second waveguide comprises providing at least one of the first and second waveguides at said point of coupling with an electro-optic portion and submitting the electro-optic portion to a controllable electric field.

13. The method of concept 12, wherein said electro-optic portion comprises an electro-optic polymer.

14. The method of concept 12, wherein the first waveguide comprises a slot waveguide and the second waveguide comprises a strip waveguide.

15. The method of concept 14, wherein the core of the first waveguide comprises a SiO2 inner core sandwiched by Si slabs and the second waveguide comprises a $Si_xN_y$ core; the first and second waveguides having a $SiO_2$ cladding.

16. The method of concept 15, wherein said layer of electro-optic material is arranged between the cores of the first and second waveguides at the point of coupling.

17. The method of concept 16, wherein said layer of electro-optic material is arranged in contact with the core of the first waveguide; the controllable opto-electronic time stretcher further comprising a tunnel layer of oxidized $Si_xN_y$ arranged in contact with the electro-optic material and a $SiO_2$ layer arranged between the tunnel layer and the core of the second waveguide.

18. A method of converting an analog input signal into a digital output signal, the method, comprising:

generating at least one light pulse having a first spectral width;

spreading in time the wavelengths of said at least one light pulse;

modulating the time-spread light pulse with said input analog signal into a modulated optical signal;

controllably time stretching the modulated optical signal according to the method of concept 10, said first waveguide receiving the modulated optical signal and said coupling with a controllable degree of coupling following a predetermined non-uniform pattern;

sampling at a predetermined rate the output of the first and second waveguide; and constructing a digital output signal corresponding to a digitized image of the analog input signal, based on the samples generated by the sampling and based on said predetermined non-uniform pattern.

19. The method of concept 18, wherein:

said generating at least one light pulse comprises generating said at least one light pulse as one light pulse of a train of identical light pulses;

said spreading in time the wavelengths of said at least one light pulse comprises generating overlapping time-spread light pulses;

said modulating the time-spread light pulse comprises modulating the overlapping time-spread light pulses with said input analog signal into said modulated optical signal;

the method further comprising separating said modulated optical signal into a plurality of successive modulated optical signal segments;

wherein said controllably time stretching the modulated optical signal according to the method of concept 10 comprises controllably time stretching separately each of the successive modulated optical signal segments by varying, according to said predetermined non-uniform pattern, a coupling between a first waveguide receiving each modulated optical signal segment and a second waveguide;

wherein said sampling at a predetermined rate the output of the first and second waveguides comprises sampling each time-stretched modulated optical signal segment at said predetermined rate; and wherein said constructing a digital output signal comprises constructing a digitized image of the input analog signal based on the samples generated for each time-stretched modulated optical signal segment, based on the order in which each time-stretched modulated optical signal segment is generated, and based on said predetermined non-uniform pattern.

20. A method of sampling an analog signal having a predetermined spectrum, the method comprising:

assuming that said analog signal corresponds to a K sparse vector of N coefficients, with K<<N;

spreading in time said analog signal according to a predetermined pseudo-random pattern into a pseudo-randomly time-spread signal;

on a predetermined time period, taking M samples by sampling the pseudo-randomly time-spread signal at a predetermined rate, said predetermined rate being inferior to the Nyquist rate, where M≥K.log(N/K);

associating the M samples to the time at which they would have been taken if said analog signal had been spread uniformly during said time period by a spread factor equal to the mean of the pseudo-randomly spread factor on said time period; and determining iteratively the closest output signal that would have allowed extracting the M samples at their associated times.

21. The method of concept 20, comprising:

assuming that the analog signal can be expressed as a K sparse vector comprising a number N of DFT coefficients, with K<<N;

assuming that the set Y of M samples is such that Y=Φ.X, where Φ is a M by N matrix;

assuming that X can be written as X=Ψ.S, where Ψ is a N×N matrix and S is a N-coefficients vector having only K non-zero coefficients, whereby Y=θ.S, with θ=Φ. Ψ;

solving the linear program:
Ŝ=argmin$\|S\|_1$, subject to Y=θ.S
where $$\|S\|_1 = \sum_{k=1}^{N} |S(k)|$$

and finding X using X=Ψ.S.

22. An electro-optical analog to digital converter having non-uniform sampling, comprising:

a source of light arranged for generating at least one light pulse having a first spectral width;

a chirp element arranged for spreading in time the wavelengths of said at least one light pulse;

an electro-optic modulator arranged for modulating the time-spread light pulse with an input analog signal into a modulated optical signal;

at least one controllable opto-electronic time stretcher arranged for variably spreading in time the modulated optical signal according to a predetermined non-uniform pattern;

at least one sampler arranged for sampling at a predetermined rate the output of the at least one controllable opto-electronic time stretcher; and a calculator arranged for constructing a digitized image of the input analog signal based on the samples generated by the at least one sampler and based on said predetermined non-uniform pattern.

23. The electro-optical analog to digital converter having non-uniform sampling of concept 22:

wherein said source of light is arranged for generating said at least one light pulse as one light pulse of a train of identical light pulses; the chirp element being arranged to generate overlapping time-spread light pulses, and the electro-optic modulator being arranged to modulate the overlapping time-spread light pulses with an input analog signal into said modulated optical signal;

wherein the electro-optical analog to digital converter further comprises a time-controlled demultiplexer for separating said modulated optical signal into a plurality of modulated optical signal segments;

wherein said at least one controllable opto-electronic time stretcher comprises one controllable opto-electronic time stretcher for variably spreading in time according to a predetermined non-uniform pattern each modulated optical signal segment;

wherein said at least one sampler comprises one sampler for sampling the output of each controllable opto-electronic time stretcher; and wherein said calculator is arranged for constructing a digitized image of the input analog signal based on the samples generated by each sampler, based on the order in which each modulated optical signal segment is generated by the demultiplexer, and based on said predetermined non-uniform pattern.

24. The electro-optical analog to digital converter having non-uniform sampling of concept 22, wherein the controllable opto-electronic time stretcher comprises:

a first wave guide;

a second waveguide coupled to the first waveguide along a coupling portion;

wherein at least one of the first and second waveguides in the coupling portion has a controllable refractive index.

25. The electro-optical analog to digital converter having non-uniform sampling of concept 24, wherein said at least one of the first and second waveguides in the coupling portion having controllable refractive index comprises an electro-optic portion and an electrode capable of submitting the electro-optic portion to a controllable electric field.

26. The electro-optical analog to digital converter having non-uniform sampling of concept 25, wherein said electro-optic portion comprises an electro-optic polymer.

27. The electro-optical analog to digital converter having non-uniform sampling of concept 24, wherein the first waveguide comprises a slot waveguide and the second waveguide comprises a strip waveguide.

28. The electro-optical analog to digital converter having non-uniform sampling of concept 27, wherein the core of the first waveguide comprises a $SiO_2$ inner core sandwiched by Si slabs and the second waveguide comprises a $Si_xN_y$ core; the first and second waveguides having a $SiO_2$ cladding.

29. The electro-optical analog to digital converter having non-uniform sampling of concept 25, wherein said electro-optic portion is arranged between the cores of the first and second waveguides in the coupling portion.

30. The electro-optical analog to digital converter having non-uniform sampling of concept 29, wherein said electro-optic portion is arranged in contact with the core of the first waveguide; the controllable opto-electronic time stretcher further comprising a tunnel layer of oxidized $Si_xN_y$ arranged in contact with the electro-optic material and a $SiO_2$ layer arranged between the tunnel layer and the core of the second waveguide.

31. A method of converting an analog input signal into a digital output signal, the method, comprising:

generating at least one light pulse having a first spectral width;

spreading in time the wavelengths of said at least one light pulse;

modulating the time-spread light pulse with said input analog signal into a modulated optical signal;

controllably time stretching the modulated optical signal according to a predetermined non-uniform pattern;

sampling at a predetermined rate the output of the first and second waveguide; and constructing a digital output signal corresponding to a digitized image of the analog input signal, based on the samples generated by the sampling and based on said predetermined non-uniform pattern.

32. The method of concept 31, wherein:

said generating at least one light pulse comprises generating said at least one light pulse as one light pulse of a train of identical light pulses;

said spreading in time the wavelengths of said at least one light pulse comprises generating overlapping time-spread light pulses;

said modulating the time-spread light pulse comprises modulating the overlapping time-spread light pulses with said input analog signal into said modulated optical signal;

the method further comprising separating said modulated optical signal into a plurality of successive modulated optical signal segments;

wherein said controllably time stretching the modulated optical signal comprises controllably time stretching separately each of the successive modulated optical signal segments according to said predetermined non-uniform pattern;

wherein said sampling at a predetermined rate the output of the first and second waveguides comprises sampling each time-stretched modulated optical signal segment at said predetermined rate; and wherein said constructing a digital output signal comprises constructing a digitized image of the input analog signal based on the samples generated for each time-stretched modulated optical signal segment, based on the order in which each time-stretched modulated optical signal segment is generated, and based on said predetermined non-uniform pattern.

33. The method of concept 31, wherein said controllably time stretching the modulated optical signal comprises:

providing a first wave guide having a first refraction index characteristic, said first waveguide receiving said input optical signal;

providing a second waveguide having a second refraction index characteristic; and coupling the second waveguide to the first waveguide with a controllable degree of coupling.

34. The method of concept 33, wherein coupling the second waveguide to the first waveguide with a controllable degree of coupling comprises controllably changing the refraction index of one of the first and second waveguide at a point of coupling between the first and second waveguides.

35. The method of concept 34, wherein said controllably changing the refraction index of one of the first and second waveguide comprises providing at least one of the first and second waveguides at said point of coupling with an electro-optic portion and submitting the electro-optic portion to a controllable electric field.

36. The method of concept 34, wherein said electro-optic portion comprises an electro-optic polymer.

37. The method of concept 36, wherein the first waveguide comprises a slot waveguide and the second waveguide comprises a strip waveguide.

38. The method of concept 37, wherein the core of the first waveguide comprises a $SiO_2$ inner core sandwiched by Si slabs and the second waveguide comprises a $Si_xN_y$ core; the first and second waveguides having a $SiO_2$ cladding.

39. The method of concept 38, wherein said layer of electro-optic material is arranged between the cores of the first and second waveguides at the point of coupling.

40. The method of concept 39, wherein said layer of electro-optic material is arranged in contact with the core of the first waveguide; the controllable opto-electronic time stretcher further comprising a tunnel layer of oxidized $Si_xN_y$ arranged in contact with the electro-optic material and a $SiO_2$ layer arranged between the tunnel layer and the core of the second waveguide.

The invention claimed is:

1. A method of sampling an analog signal having a predetermined spectrum, the method comprising:

when said analog signal corresponds to a K sparse vector of N coefficients, with K<<N, using one or more opto-electronic devices, spreading in time said analog signal according to a predetermined pseudo-random pattern into a pseudo-randomly time-spread signal;

on a predetermined time period, taking M samples by sampling the pseudo-randomly time-spread signal at a predetermined rate, said predetermined rate being lower than the Nyquist rate, where M≥K.log(N/K);

associating the M samples to the time at which they would have been taken if said analog signal had been spread uniformly during said time period by a spread factor equal to the mean of the pseudo-randomly spread factor on said time period; and determining iteratively the closest output signal that would have allowed extracting the M samples at their associated times.

2. The method of claim 1, comprising:

when the analog signal can be expressed as a K sparse vector comprising a number N of DFT coefficients, with K<<N, when the set Y of M samples is such that Y=Φ.X, where Φ is a M by N matrix, and when X can be written as X=Ψ.S, where Ψ is a N×N matrix and S is a N-coefficients vector having only K non-zero coefficients, whereby Y=θ.S, with θ=Φ.Ψ, solving the linear program:

Ŝ=argmin||S||1, subject to Y=θ.S where $$\|S\|_1 = \sum_{k=1}^{N} |S(k)|$$

and finding X using X=Ψ.S.

3. An electro-optical analog to digital converter having non-uniform sampling, comprising:

a source of light arranged for generating at least one light pulse having a first spectral width;

a chirp element arranged for spreading in time the wavelengths of said at least one light pulse;

an electro-optic modulator arranged for modulating the time-spread light pulse with an input analog signal into a modulated optical signal;

at least one controllable opto-electronic time stretcher arranged for variably spreading in time the modulated optical signal according to a predetermined non-uniform pattern;

at least one sampler arranged for sampling at a predetermined rate the out put of the at least one controllable opto-electronic time stretcher; and a calculator arranged for constructing a digitized image of the input analog signal based on the samples generated by the at least one sampler and based on said predetermined non-uniform pattern.

4. The electro-optical analog to digital converter having non-uniform sampling of claim 3:

wherein said source of light is arranged for generating said at least one light pulse as one light pulse of a train of identical light pulses; the chirp element being arranged to generate overlapping time-spread light pulses, and the electro-optic modulator being arranged to modulate the overlapping time-spread light pulses with an input analog signal into said modulated optical signal;

wherein the electro-optical analog to digital converter further comprises a time-controlled demultiplexer for separating said modulated optical signal into a plurality of modulated optical signal segments;

wherein said at least one controllable opto-electronic time stretcher comprises one controllable opto-electronic time stretcher for variably spreading in time according to a predetermined non-uniform pattern each modulated optical signal segment;

wherein said at least one sampler comprises one sampler for sampling the output of each controllable opto-electronic time stretcher; and wherein said calculator is arranged for constructing a digitized image of the input analog signal based on the samples generated by each sampler, based on the order in which each modulated optical signal segment is generated by the demultiplexer, and based on said predetermined non-uniform pattern.

5. The electro-optical analog to digital converter having non-uniform sampling of claim 3, wherein the controllable opto-electronic time stretcher comprises:
a first wave guide;
a second waveguide coupled to the first waveguide along a coupling portion;
wherein at least one of the first and second waveguides in the coupling portion has a controllable refractive index.

6. The electro-optical analog to digital converter having non-uniform sampling of claim 5, wherein said at least one of the first and second waveguides in the coupling portion having controllable refractive index comprises an electro-optic portion and an electrode capable of submitting the electro-optic portion to a controllable electric field.

7. The electro-optical analog to digital converter having non-uniform sampling of claim 6, wherein said electro-optic portion comprises an electro-optic polymer.

8. The electro-optical analog to digital converter having non-uniform sampling of claim 5, wherein the first waveguide comprises a slot waveguide and the second waveguide comprises a strip waveguide.

9. The electro-optical analog to digital converter having non-uniform sampling of claim 8, wherein the core of the first waveguide comprises a $SiO_2$ inner core sandwiched by Si slabs and the second waveguide comprises a $Si_xN_y$ core; the first and second waveguides having a $SiO_2$ cladding.

10. The electro-optical analog to digital converter having non-uniform sampling of claim 6, wherein said electro-optic portion is arranged between the cores of the first and second waveguides in the coupling portion.

11. The electro-optical analog to digital converter having non-uniform sampling of claim 10, wherein said electro-optic portion is arranged in contact with the core of the first waveguide; the controllable opto-electronic time stretcher further comprising a tunnel layer of oxidized $Si_xN_y$ arranged in contact with the electro-optic material and a $SiO_2$ layer arranged between the tunnel layer and the core of the second waveguide.

12. A method of converting an analog input signal into a digital output signal, the method, comprising:
generating at least one light pulse having a first spectral width;
spreading in time wavelengths of said at least one light pulse;
modulating the time-spread light pulse with said input analog signal into a modulated optical signal;
controllably time stretching the modulated optical signal according to a predetermined non-uniform pattern;
sampling at a predetermined rate an output of a first and a second waveguide; and
constructing a digital output signal corresponding to a digitized image of the analog input signal, based on the samples generated by the sampling and based on said predetermined non-uniform pattern.

13. The method of claim 12, wherein:
said generating at least one light pulse comprises generating said at least one light pulse as one light pulse of a train of identical light pulses;
said spreading in time the wavelengths of said at least one light pulse comprises generating overlapping time-spread light pulses;
said modulating the time-spread light pulse comprises modulating the overlapping time-spread light pulses with said input analog signal into said modulated optical signal;
the method further comprising separating said modulated optical signal into a plurality of successive modulated optical signal segments;
wherein said controllably time stretching the modulated optical signal comprises controllably time stretching separately each of the successive modulated optical signal segments according to said predetermined non-uniform pattern;
wherein said sampling at a predetermined rate the output of the first and second waveguides comprises sampling each time-stretched modulated optical signal segment at said predetermined rate; and
wherein said constructing a digital output signal comprises constructing a digitized image of the input analog signal based on the samples generated for each time-stretched modulated optical signal segment, based on the order in which each time-stretched modulated optical signal segment is generated, and based on said predetermined non-uniform pattern.

14. The method of claim 12, wherein said controllably time stretching the modulated optical signal comprises:
providing the first wave guide having a first refraction index characteristic, said first waveguide receiving said input optical signal;
providing the second waveguide having a second refraction index characteristic; and
coupling the second waveguide to the first waveguide with a controllable degree of coupling.

15. The method of claim 14, wherein coupling the second waveguide to the first waveguide with a controllable degree of coupling comprises controllably changing the refraction index of one of the first and second waveguide at a point of coupling between the first and second waveguides.

16. The method of claim 15, wherein said controllably changing the refraction index of one of the first and second waveguide comprises providing at least one of the first and second waveguides at said point of coupling with an electro-optic portion and submitting the electro-optic portion to a controllable electric field.

17. The method of claim 15, wherein said electro-optic portion comprises an electro-optic polymer.

18. The method of claim 17, wherein the first waveguide comprises a slot waveguide and the second waveguide comprises a strip waveguide.

19. The method of claim 18, wherein the core of the first waveguide comprises a $SiO_2$ inner core sandwiched by Si slabs and the second waveguide comprises a $Si_xN_y$ core; the first and second waveguides having a $SiO_2$ cladding.

20. The method of claim 19, wherein said layer of electro-optic material is arranged between the cores of the first and second waveguides at the point of coupling.

21. The method of claim 20, wherein said layer of electro-optic material is arranged in contact with the core of the first waveguide; the controllable opto-electronic time stretcher further comprising a tunnel layer of oxidized $Si_xN_y$ arranged in contact with the electro-optic material and a $SiO_2$ layer arranged between the tunnel layer and the core of the second waveguide.

* * * * *